United States Patent [19]

Harada

[11] Patent Number: 5,031,130

[45] Date of Patent: Jul. 9, 1991

[54] PSEUDORANDOM NOISE CODE GENERATOR

[75] Inventor: Masaaki Harada, Tokyo, Japan

[73] Assignee: Clarion Co., Ltd., Tokyo, Japan

[21] Appl. No.: 389,284

[22] Filed: Aug. 2, 1989

[30] Foreign Application Priority Data

Aug. 10, 1988 [JP] Japan .................................. 63-200825

[51] Int. Cl.$^5$ ................................................ G06F 7/58
[52] U.S. Cl. ................................................ 364/717
[58] Field of Search ............................. 364/717; 371/1

[56] References Cited

U.S. PATENT DOCUMENTS

| | | | |
|---|---|---|---|
| 4,320,513 | 3/1982 | Lampert | 375/1 |
| 4,748,576 | 5/1988 | Beker et al. | 364/717 |
| 4,785,410 | 11/1988 | Hamatsu et al. | 364/717 |
| 4,837,790 | 6/1989 | Harada | 377/33 |
| 4,845,654 | 7/1989 | Harada et al. | 364/717 |
| 4,847,861 | 7/1989 | Hamatsu et al. | 375/1 |
| 4,912,666 | 3/1990 | Harada | 364/717 |

Primary Examiner—David H. Malzahn
Attorney, Agent, or Firm—Flynn, Thiel, Boutell & Tanis

[57] ABSTRACT

A pseudorandom noise code generator including a simple type or modular type shift register generator which can simultaneosuly generate a plurality of GOLD codes, using two maximal sequence codes, and uses an initial value setting circuit for such GOLD codes so that code outputting never become unstable upon code setting or code changing of such GOLD codes.

13 Claims, 12 Drawing Sheets

PSEUDORANDOM NOISE CODE GENERATOR

FIELD OF THE INVENTION

This invention relates to a pseudorandom noise code generator (hereinafter simply called "code generator") which can generate any desired maximal sequence code under external controls of the code period, code pattern and code phase, and which includes a GOLD code generating circuit therein.

BACKGROUND OF THE INVENTION

A conventional code generator of the above-indicated type has a circuit arrangement, for example, as shown in FIG. 11. In FIG. 11, $SR_1$ through $SR_{n-1}$ and $SR_f$ refer to flipflops, and $E_i$ through $E_n$ indicate exclusive logic sum gates. They all form a so-called modular type shift register generator. MUX 1 designates a multiplexer which selects the final stage of operation of the modular type shift register generator to control the number of stages of the modular type shift register generator. $AND_2$ through $AND_n$ denote AND gates which specify the presence or absence of feedback of signals from the final stage output to respective stages of the modular type shift regirter generator. $G_1$ through $G_n$ denote steering gates for setting the initial value of the modular type shift register generator. More specifically, the code period, code pattern and code phase are controlled independently of each other, by controlling the code period by determining the address of the multiplexer MUX 1 by means of data $c_1$ to $c_i$ and determining the number of stages of the modular type shift register generator; by controlling the code pattern by determining the feedback condition of signals from the final stage to respective stages of the modular type shift register generator by means of data $a_2$ to $a_n$; and by controlling the code phase by determining the initial value of the modular type shift register generator by means of data $b_1$ to $b_n$. In this way, any desired maximal sequence code can be generated.

A feature of this system is that it includes therein GOLD code generating circuits $E_g$ and $SR_g$ which are disclosed in Japanese Patent Application No. 61-253993 filed Oct. 24, 1986, corresponding to U.S. Pat. No. 4,837,790 and GOLD codes can readily be generated by connecting two code generators of FIG. 11 as shown in FIG. 12. In FIG. 12, PNG 1 and PNG 2 denote pseudorandom noise code generators, u and v indicate maximal sequence codes, and T designates a left cyclic shift computing element. A GOLD code is obtained by adding different maximal sequence codes in modulo 2. Since GOLD codes may have much more kinds of patterns for a frequency than maximal sequence codes, the use of GOLD codes is more advantageous when a multiple signal using a number of codes must be used in application of the circuit to a spread-spectrum communication system, etc.

The existing system, however, cannot output more than one kind of GOLD code at once, using two code generators, and it therefore requires a number of code generators for a multi-channel arrangement.

OBJECT OF THE INVENTION

It is therefore an object of the invention to provide a pseudorandom noise code generator which can output two or more GOLD codes simultaneously, using two maximal sequence code generators, and includes therein a circuit for setting the initial value of GOLD codes in order to prevent that the code output becomes uncertain upon code establishment and code changeover of the GOLD codes.

SUMMARY OF THE INVENTION

In order to attain the object, an inventive pseudorandom noise code generator is characterized in the use of a simple type or modular type shift register generator; exclusive logic sum gates at respective stages in which outputs of flipflops forming the simple type or modular type shift register generator and an external maximal sequence code are entered; and a plurality of flipflops whose outputs are controlled by a clock and in which outputs of said exclusive logic sum gates are entered.

There are two known basic arrangements of maximal sequence code generator as shown in FIG. 2. In FIG. 2(a), outputs of respective flipflops $D\text{-}FF_1$ through $D\text{-}FF_n$ are selected by switches $SW_2$ to $SW_n$, and their exclusive logic sum is obtained, fed back to the first stage flipflop. In FIG. 2(b), the output of the final stage flipflop is selected by the switches $SW_2$ to $SW_n$. The exclusive logic sum of the selected output and an output of the flipflop at the preceding stage is obtained, and it is entered in respective flipflops. In general, the former is called a "simple type shift register generator" and the latter is called a "modular type shift register generator". The modular type shift register generator is more advantageous for speed-up purposes because an increase in the number of stages of the shift register of the simple type shift register generator invites an increase in the number of stages of exclusive logic sum gates in the feedback route and invites an increase in the delay time (reference document: R.C Dixon, Spread Spectrum Systems, pp. 53-92, John Wiley & Sons, 1976). The invention proposes a system which uses a simple type shift register generator and a modular type shift register generator to enable simultaneous generation of a plurality of GOLD codes.

DETAILED DESCRIPTION

Figure 1:
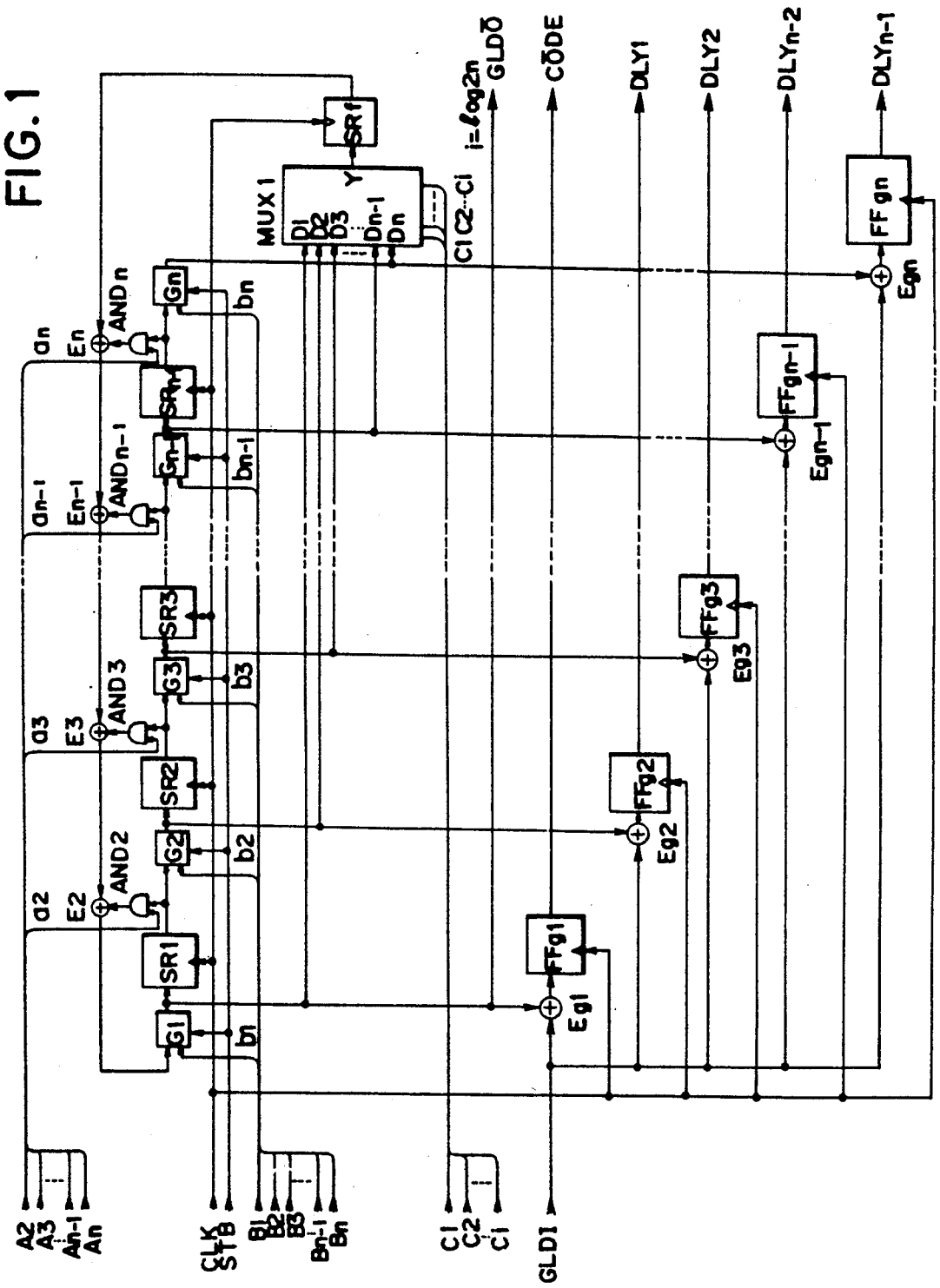
FIG. 1 is a block diagram of a pseudorandom noise code generator using a simple type shift register generator.
Figure 2A:
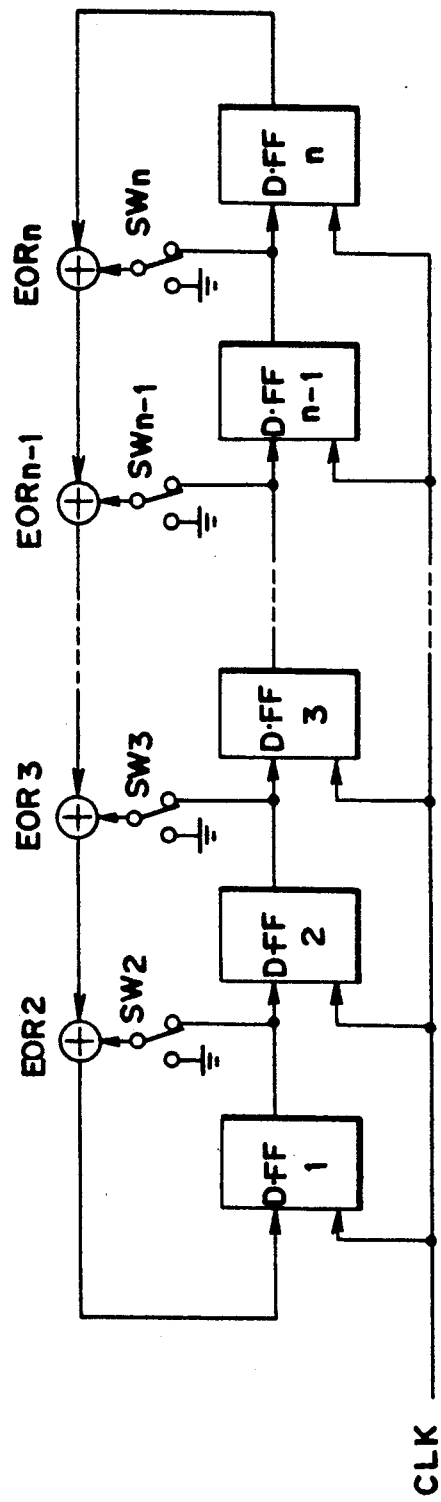
FIGS. 2A and 2B show basic arrangements of a maximal sequence code generator.
Figure 2B:
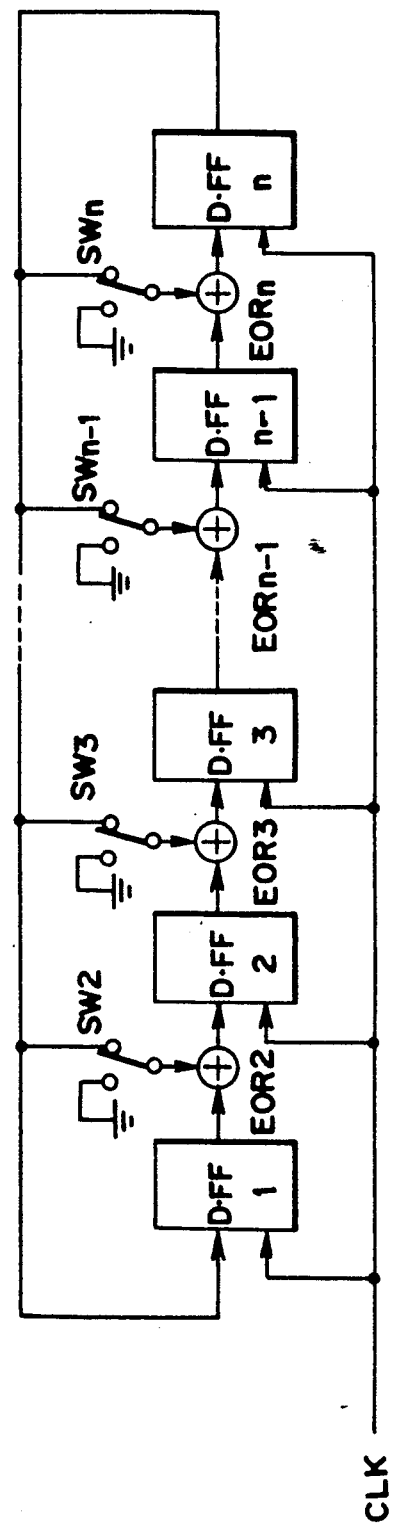

The invention is described below in a greater detail, referring to preferred embodiments illustrated in the drawings. The embodiments are not but examples, and the invention involves various modifications and improvements without departing from the scope thereof.

FIG. 1 shows a pseudorandom noise code generator using a simple type shift register. In the drawings, $E_2$ to $E_n$ refer to exclusive logic sum gates, $AND_2$ through $AND_n$ indicate AND gates, $SR_l$ through $SR_{n-1}$ and $SR_f$ are flipflops. They all form a simple type shift register generator. $G_l$ through $G_n$ indicate steering gates for setting the initial value of the flipflops $SR_l$ to $SR_{n-1}$ and $SR_f$. When an STB signal is "L" level, they each output an output of the preceding stage flipflop in the original form and, when the STB signal is "H" level, they output data $b_l$ through $b_n$ from terminals $B_l$ through $B_n$ as the initial value of the flipflops. MUX 1 indicates a multiplexer which controls the number of stages in operation of the simple type shift register generator. The flipflop $SR_f$ which receives an output of the multiplexer MUX 1 always behaves as the final stage in operation of the simple type shift register generator. More specifically, the pattern of the code is set by specifying the presence or absence of feedback of signals from flipflops of respective stages by means of data $a_2$ to $a_n$ entered from terminals $A_2$ through $A_n$, the phase of the code is set by specifying the initial value of the flipflops by means of data $b_l$ through $b_n$ entered from terminals $B_l$ through $B_n$, and the period of the code is set by specifying the number of stages of the shift register by means of data $c_l$ through $c_i$ entered from terminals $C_l$ through $C_i$. Thus the pattern, phase and period of the code can be controlled independently of each other, and any desired maximal sequence code can be generated.

In the drawing, GLDI is an input terminal in which maximal sequence codes having an identical frequency and different patterns are entered in synchronization with the illustrated code generator. $Eg_l$ through $Eg_n$ indicate exclusive logic sum gates which compute an exclusive logic sum of an input signal to the flipflops $SR_l$ through $SR_n$ and $SR_f$ and a signal entered in the input terminal GLDI. $FFg_l$ through $FFg_n$ indicate flipflops for receiving a resulting exclusive logic sum from $Eg_l$ through $Eg_n$, for removing a hazard produced during computation of the exclusive logic sum and for outputting it to the exterior in synchronization with a clock. From terminals CODE and $DLY_l$ through $DLY_n$ are obtained different kinds of GOLD code outputs. When outputting a maximal sequence code from the instant code generator, the input terminal GLDI is maintained in "L" level. At this time, maximal sequence codes having the same pattern and having different phases are outputted from terminals CODE and $DLY_l$ through $DLY_n$.

The above-described embodiment operates as explained below.

Figure 3:
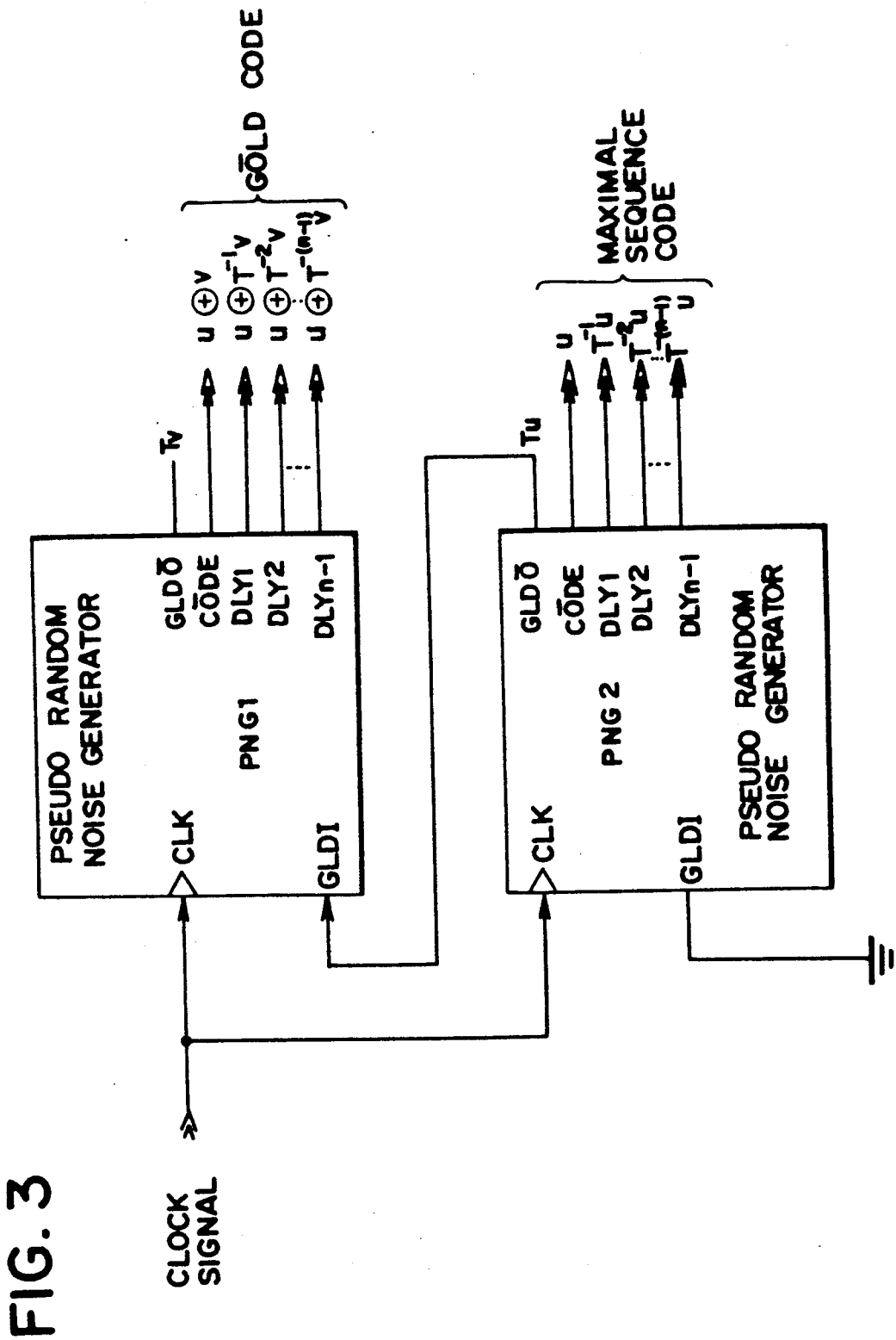
FIG. 3 is a connection diagram of a GOLD code generator using an inventive pseudorandom noise code generator.

Here the operation of the inventive code generator is explained in a greater detail, referring to FIGS. 1 and 3. The simple type shift register generator is in the form of a usual type shift register where the flip-flops $SR_l$ through $SR_n$ in FIG. 1 sequentially shift data in the original form to respective next stages at 1 clock intervals. Therefore, as the number indicative of a flipflop increases, code outputs sequentially delayed in phase by every one chip are obtained. Indicating a maximal sequence code by a matrix v and indicating the matrix of the condition change by T, outputs of flipflops are expressed as follows:

output of $SR_1$ is $v$ output of $SR_2$ is $T^{-1}v$ output of $SR_3$ is $T^{-2}v$

.
.
.

output of $SR_i$ is $T^{-(i-1)}v$

.
.
.

output of $SR_{n-1}$ is $T^{-(n-2)}v$

That is, $T^{-i}v$ indicates that a maximal sequence code v is in a phase delay by i chips.

Further, respective flipflops are delay elements, and considering that the phase of the input is in advance by 1 chip with respect to the output, inputs to the flipflops are expressed as follows:

input to $SR_1$ is $Tv$ input to $SR_2$ is $v$ input to $SR_3$ is $T^{-1}v$

.
.
.

input to $SR_i$ is $T^{-(i-2)}v$

.
.
.

input $SR_{n-1}$ is $T^{-(n-3)}v$

Further, an output from the steering gate G equals the output of $SR_{n-1}$ and is expressed by $T^{-(n-2)}v$.

Assume here that the code generator PNG 1 generates the maximal sequence code v, the code generator PNG 2 generates a maximal sequence code u having a different pattern, and they are connected as shown in FIG. 3. In this case, since the exclusive logic sum gate $Eg_i$ in the code generator PNG 1 performs computation of an exclusive logic sum of $T_u$ and $T^{-(i-2)}v$ and outputs it to the flipflop $FFg_i$, the output of the flipflop $FFg_i$ may be expressed by $T^{-1}(T_uT^{-(i-2)}v$, i.e. $uT^{-(i-1)}v$. Therefore, outputs from respective terminals are expressed as follows:

CODE output (output of $FFg_1$) is $u \oplus v$ $DLY_1$ output (output of $FFg_2$) is $u \oplus T^{-1}v$ $DLY_2$ output (output of $FFg_3$) is $u \oplus T^{-2}v$

.
.
.

$DLY_{n-1}$ output (output of $FFg_n$) is $u \oplus T^{-(n-1)}v$ so that GOLD code outputs having different patterns are obtained at respective code output terminals.

Figure 4:
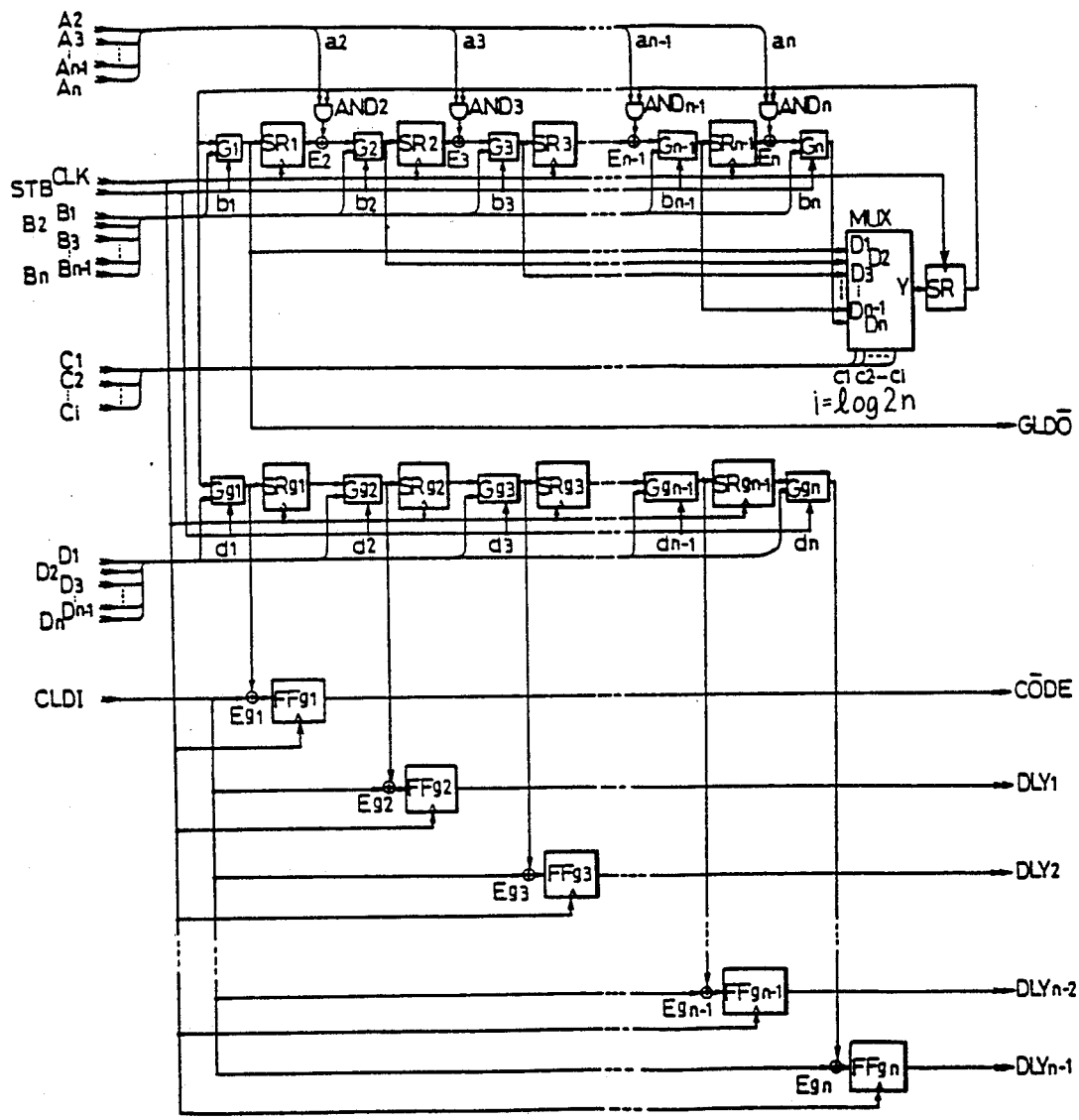
FIG. 4 is a block diagram of a pseudorandom noise code generator using a modular type shift register generator.
Figure 11:
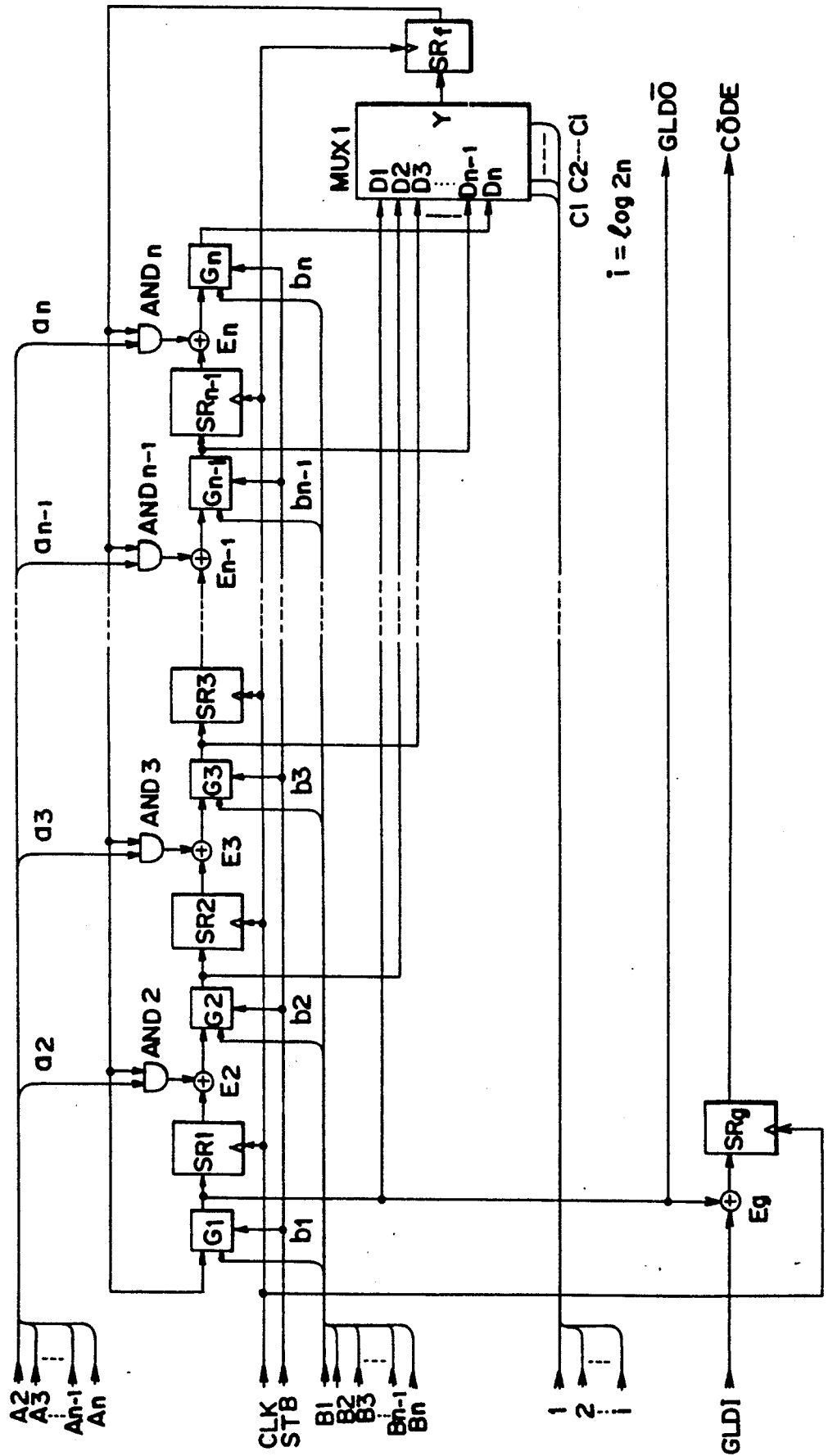
FIG. 11 is a basic block diagram of an existing pseudorandom noise code generator.
Figure 12:
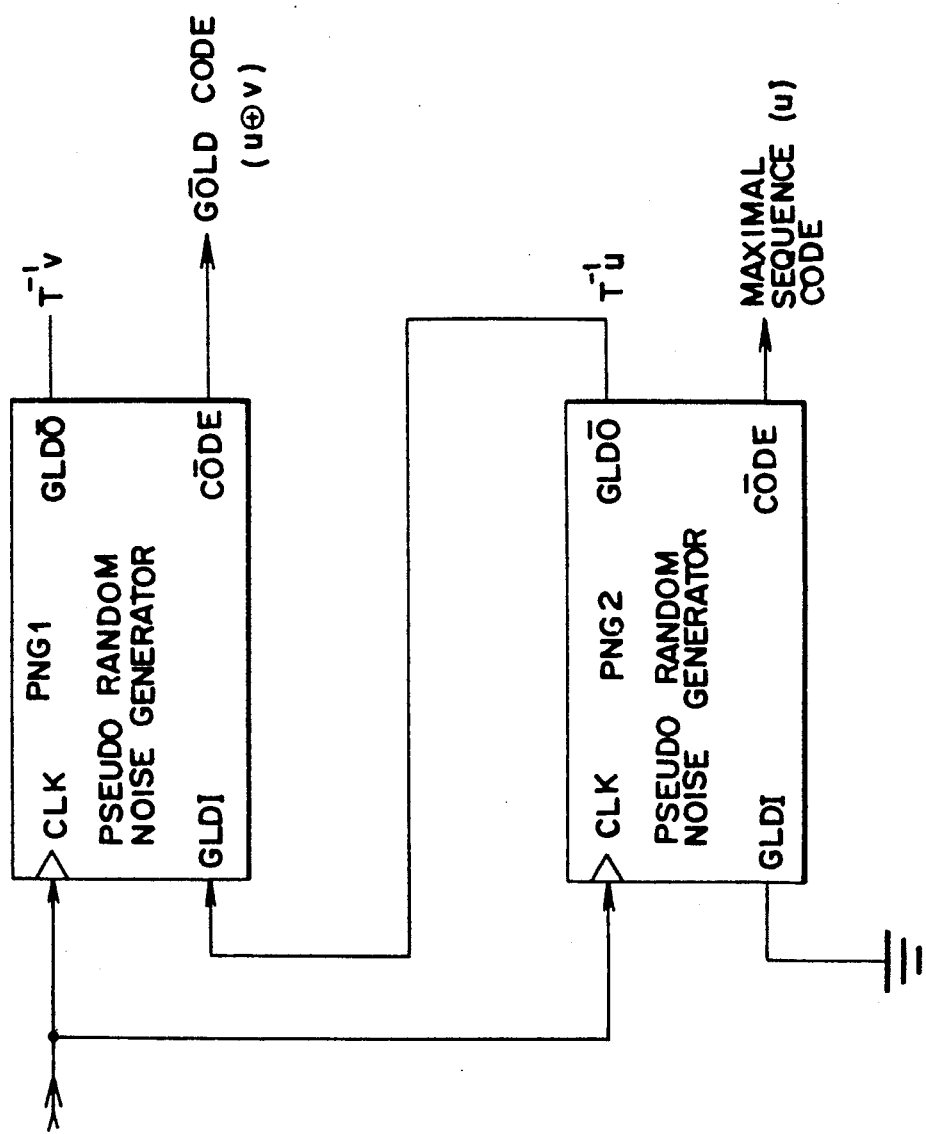
FIG. 12 is a connection diagram of a GOLD code generating circuit using an existing pseudorandom noise code generator.

FIG. 4 shows an inventive pseudorandom noise code generator using a modular type shift register generator. In the drawing, the basic portions of the modular type shift register generator labeled with the same reference numerals as those in FIG. 11 are in the form of the prior art system, and have identical functions. Further, an input terminal GLDI, output terminals GLDO, CODE, DLY1 through $DLY_{n-1}$, exclusive logic sum gates $Eg_l$ through $Eg_n$ and flipflops FFg1 through FFgn having the same reference numerals or symbols as those in FIG. 11 also have identical functions as the simple type shift register generator of FIG. 1, and are capable of simultaneously generating a plurality of GOLD codes having different patterns in the same manner. The modular type shift register generator is different from the simple type shift register generator in that the modular type shift register generator of FIG. 4 includes exclusive logic sum gates inserted between respective stages of the flipflops $SR_l$ through $SR_{n-1}$ and this causes changes in the phase difference of codes outputted from the respective flipflops, depending on the established code. Therefore, such a modular type shift register generator has a drawback that it cannot obtain a code output having a necessary phase difference from a specified flipflop.

In order to overcome the problem, the code generator of FIG. 4 includes shift registers $SRg_1$ through $SRg_{n-1}$ separately from the generator portion. Since code extracting positions of the terminals CODE and DLY1 through $DLY_{n-1}$ are associated with the flipflops $SR_l$ through $SR_n$ of the simple type shift register generator of FIG. 1, contents of the shift register $SRg_l$ through $SRg_{n-1}$ of FIG. 4 fully coincide with the shift register $SR_l$ through $SR_{n-1}$ while codes having the same period, same pattern and same phase are outputted. Therefore, by connecting two modular type shift register generators of FIG. 4 as shown in FIG. 3, it can be explained in the fully same manner as in the case of the simple type shift register generator that GOLD codes having different patterns are obtained from terminals CODE and DLY1 through $DLY_{n-1}$.

In the code generator of this type, since codes generated by the modular type shift register generator are sequentially serially entered in the shift registers $SRg_l$ through $SRg_{n-1}$ at 1 bit intervals, the condition of the shift register becomes uncertain during the period of clock n−1 after code establishment, and this makes it impossible to obtain precise code outputs. This is a serious problem particularly for use in a system which requires frequent code changes or for use in spreadspectrum communication in which codes are re-outputted from the initial condition by a trigger action using an STB signal in order to establish phase coincidence between the transmitter and a receiver. In order to remove the problem, the inventive code generator includes steering gates $Gg_l$ through $Gg_n$ for giving the shift register $SRg_l$ through $SRg_{n-1}$ the initial value. The initial value must be applied as $d_0$ through $d_n$ from the exterior through the input terminals $D_l$ through $D_n$. However, under a condition where codes having the same period, same pattern and same phase are outputted from respective code output terminals of the simple type shift register generator of FIG. 1 and the modular type shift register generator of FIG. 4, it evidently suffices the requirements to apply to $d_l$ through $d_n$ data $b_l$ through $b_n$ which is the initial value of flipflops $SR_l$ through $SR_{n-1}$ and $SR_f$ applied for obtaining identical code outputs in the simple type shift register generator of FIG. 1 because contents of the flipflops $SR_l$ through $SR_{n-1}$ of the simple type shift register generator completely coincide with contents of the shift register $SRg_l$ through $SRg_{n-1}$ of the modular type shift register generator.

In the aforegoing embodiment of FIG. 4, in order to prevent that outputs becomes unstable just after code outputting begins, the steering gates $Gg_l$ through $Gg_n$ are provided between respective stages of the shift register $SRg_l$ through $SRg_{n-1}$ and the initial value of the shift register $SRg_l$ through $SRg_{n-1}$ is established from the exterior. However, this method has a first problem that it requires input terminals $D_l$ through $D_n$ or other means for entering the initial value from the exterior an this causes an increase in the number of pins or the number of elements for incorporation into an IC. A second problem of this method is that the initial data $d_l$ through $d_n$ of the shift register $SRg_l$ through $SRg_{n-1}$ must be obtained precedingly by some means for all codes to be established.

In this connection, the code generator of FIG. 4 includes therein a circuit which automatically calculates the initial value, of the shift register provided for obtaining code outputs in phase delay be very one chip from the modular type shift register generator, from the code data applied to the modular type shift register generator. In this way, the code generator of FIG. 4 makes it possible to omit the process and means for applying the initial value of the shift register from the exterior.

Figure 5:
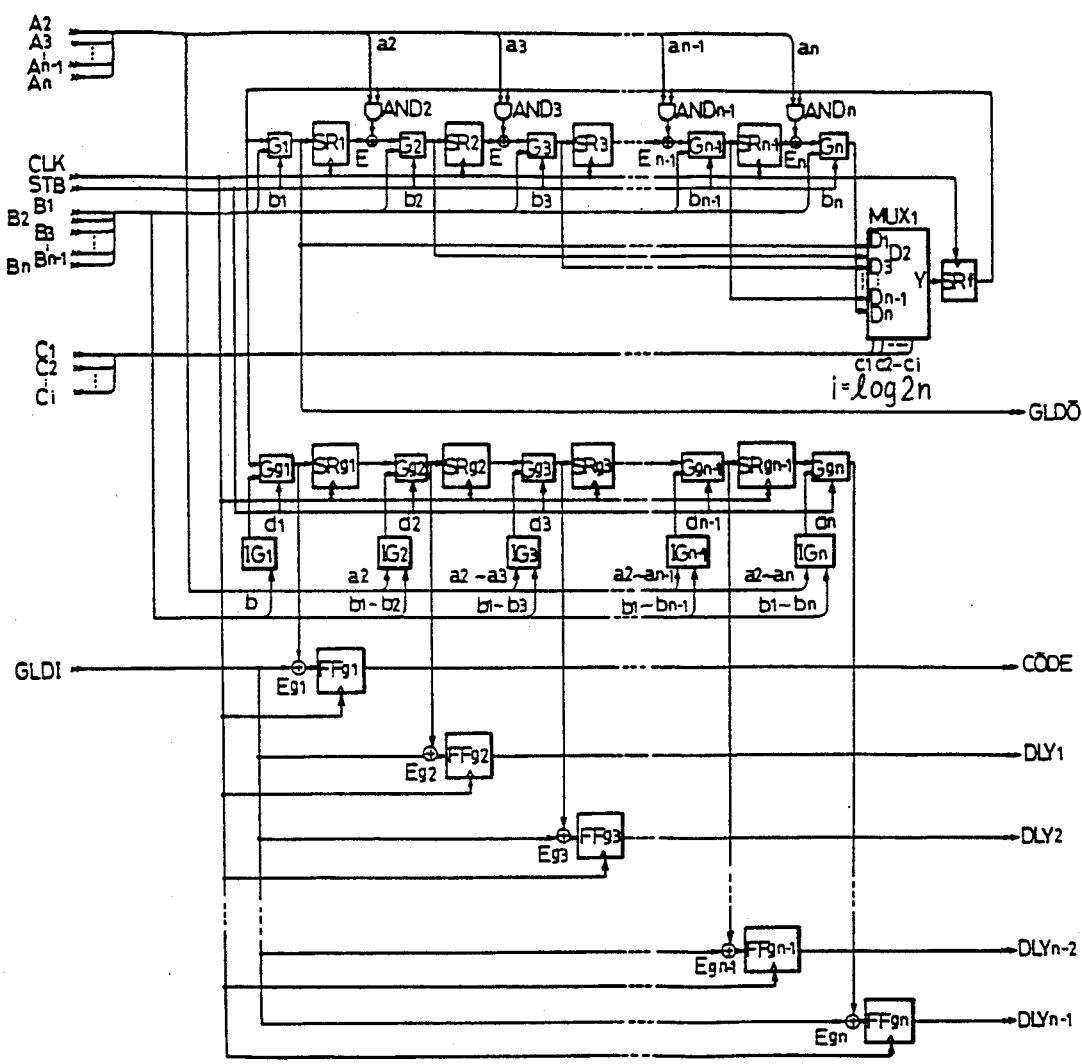
FIG. 5 is a block diagram of a pseudorandom noise code generator using a modular type shift register generator including a circuit for calculating the initial value of a shift register therein.

FIG. 5 is a block diagram of a pseudorandom noise code generator according to the embodiment. In the drawing, portions having the same reference numerals as those in FIG. 4 form the entirely same arrangement as FIG. 4 and have the same functions. A difference of the system of FIG. 5 from the system of FIG. 4 is that an initial value calculating circuit $IG_l$ through $IG_n$ is provided for the shift register $SRg_l$ through $SRg_{n-1}$. The initial value calculating circuit $IG_l$ through $IG_n$ calculate the initial value of the shift register $SRg_l$ through $SRG_{n-1}$ from code data $a_2$ through $a_n$ and $b_2$ through $b_n$ of the modular type shift register generator, and apply it to the respective flipflops through the steering gates $Gg_l$ through $Gg_{n-1}$. Therefore, the method of the embodiment can obtain precise code outputs just after the code outputting is initiated, without precedingly obtaining the initial value of the shift register by some particular means or setting it from the exterior.

Figure 6:
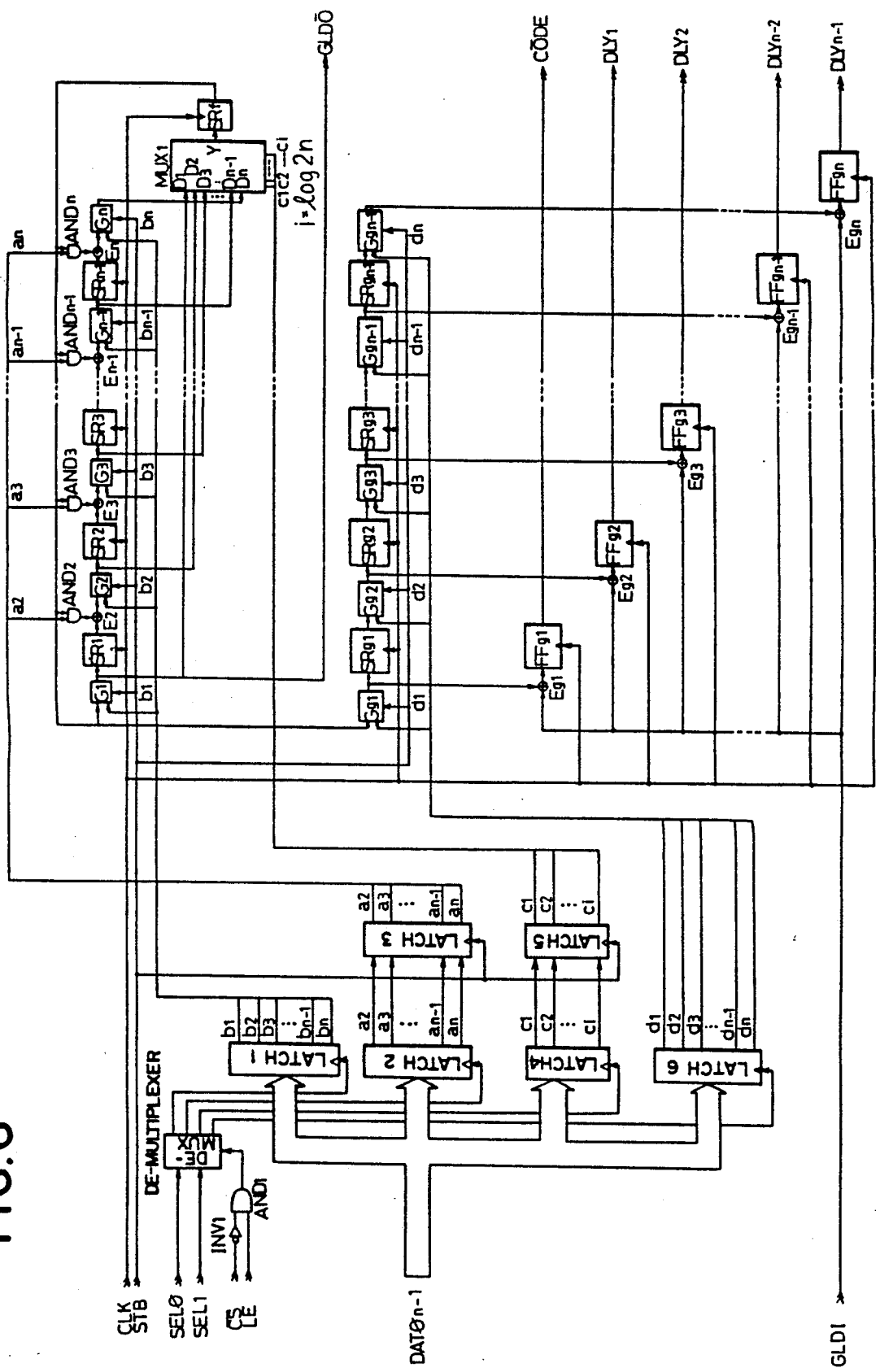
FIG. 6 is a block diagram of a modification of the circuit of FIG. 4, intended for incorporation into an IC.
Figure 8:
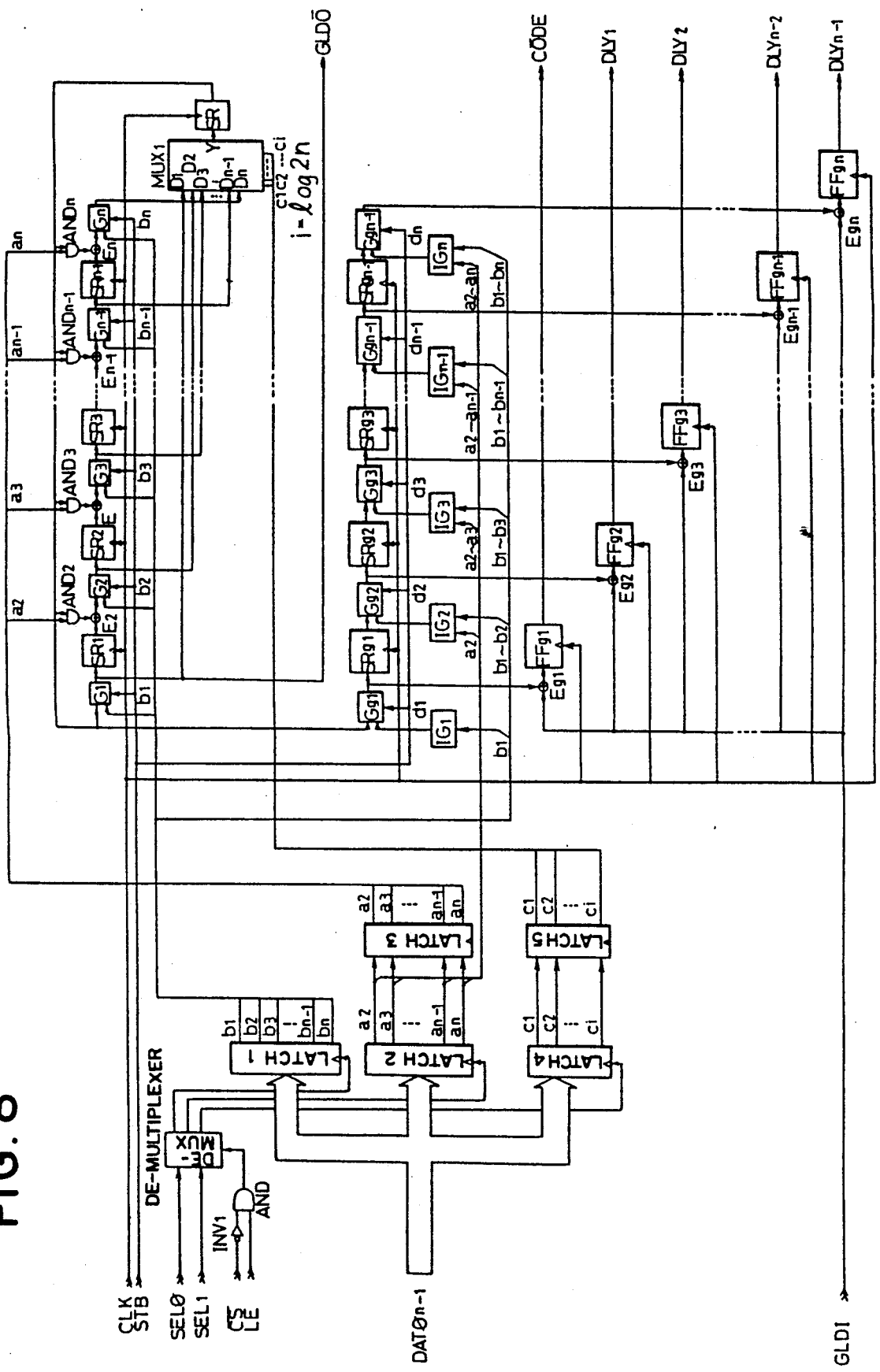
FIG. 8 is a block diagram of a modification of the circuit of FIG. 5, intended for incorporation into an IC.

FIG. 6 shows a circuit arrangement of the code generator of FIG. 4, considering incorporation thereof into an IC, and FIG. 8 shows such a circuit arrangement of the code generator of FIG. 5. Since an increase in the number of terminals is an important problem for incorporation into an IC, it is general that code data $a_2$ through $a_n$, $b_l$ through $b_n$, $c_l$ through $c_n$ and $d_l$ through $d_n$ are entered in a time division from data lines $DAT_0$ through $DAT_{n-1}$ of n bits. In FIGS. 6 and 8, LATCH 1, LATCH 2, LATCH 4 and LATCH 6 are latch circuits for entering under a time division and holding code phase data $b_l$ through $b_n$, code pattern data $a_2$ through $a_n$, code period data $c_l$ through $c_i$ and the initial value $d_l$ through $d_n$, respectively. LATCH 4 and LATCH 5 are latch circuits for holding presently outputted code data so that an output code is not changed during establishment of code data. Since code phase data $b_l$ through $b_n$ and the initial value $d_l$ through $d_n$ are required to be fixed when the code outputting is initiated, but need not be fixed otherwise, a two-stage latch arrangement is not required. Further, two-bit signal input terminals SEL 0 and SEL 1 are used for address appointment of latches for writing data therein, and are configured to select one of four latch circuits through a demultiplexer DE-MUX. CS refers to a chip select signal input terminal, and LE denotes a latch enable signal input terminal. They are used for selecting an IC for writing data thereon and for controlling the timing of writing data, respectively. When entry of all code data is completed by them, it is possible to enter a strobe signal from the STB terminal and begin a new code outputting.

Figure 7:
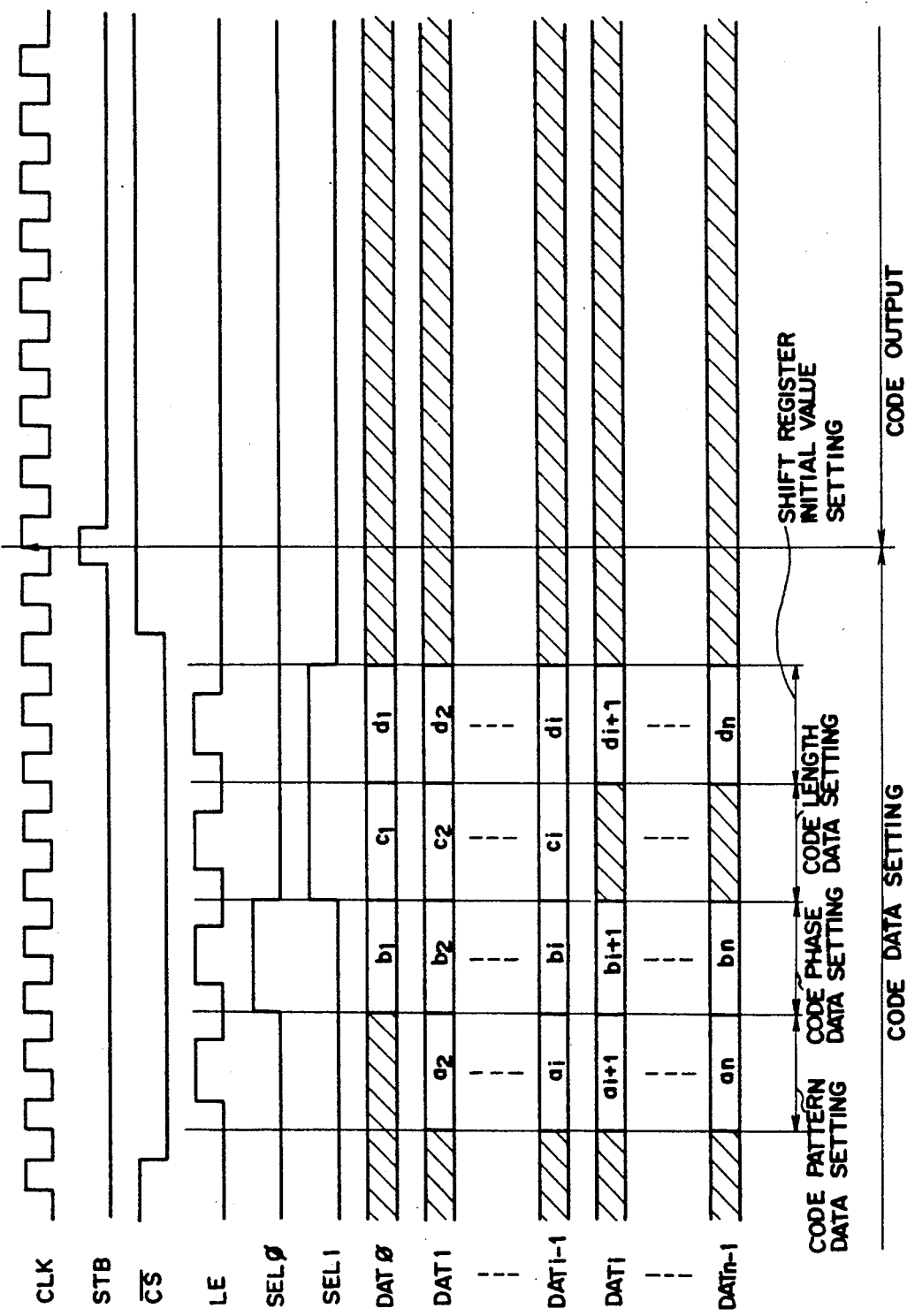
FIG. 7 is a timing chart for a code setting process in the circuit of FIG. 6.
Figure 9:
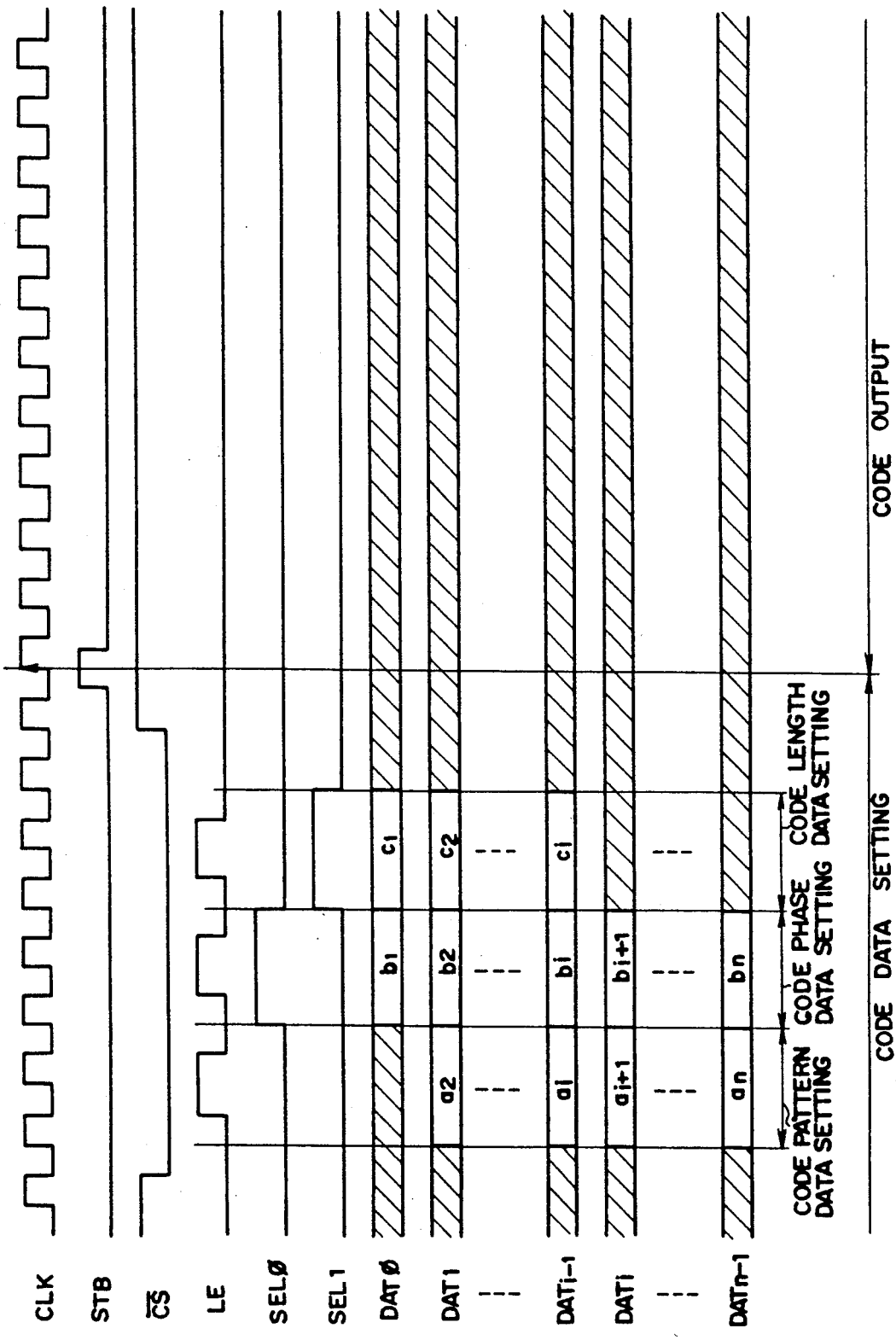
FIG. 9 is a timing chart for a code setting process in the circuit of FIG. 8.

Thus using the time-division entry system of code data, the circuits of FIG. 6 and FIG. 8 can be formed of the same number of terminals. However, the circuit of FIG. 8 does not require the latch 6 used in the circuit of FIG. 6 in order to calculate the initial value of the shift register in the interior, and this enables reduction in the number of elements accordingly. FIG. 7 and FIG. 9 are timing charts for code establishment of the code generators of FIGS. 6 and 8, respectively. They show that the circuit of FIG. 8 can reduce the process and time for code establishment by an amount for setting the initial value of the shift register, as compared to the circuit of FIG. 6. In FIGS. 7 and 9, hatched portions show that the signal conditions are not related to establishment of codes.

A specific example of initial value calculating circuit is shown below, taking the code generator of the arrangement of the embodiment of FIG. 5. For purposes of explanation of the initial value calculating method, assume that $sr_1(t)$ through $sr_{n-1}(t)$ and $sr_f(t)$ indicate conditions at the t-th chip after initiation of code output of respective flipflops $SR_1$ through $SR_{n-1}$ and $SR_f$ forming the modular type shift register generator, and $srg_1(t)$ and $srg_{n-1}(t)$ indicate conditions at the t-th chip after initiation of code output of the shift register $SRg_1$ through $SRg_{n-1}$. Then the initial value of the flipflops $SR_1$ through $SR_{n-1}$, $SR_f$ and $SRg_1$ through $SRg_{n-1}$ are expressed as follows:

$$sr_1(1) = b_1$$
$$sr_2(1) = b_2$$
$$sr_3(1) = b_3$$
$$\vdots$$
$$sr_{n-1}(1) = b_{n-1}$$
$$sr_f(1) = b_n \quad \text{and}$$
$$srg_1(1) = d_1$$
$$srg_2(1) = d_2$$
$$srg_3(1) = d_3$$
$$\vdots$$
$$srg_{n-1}(1) = d_{n-1}$$

Further, since $srg_1$ through $srg_{n-1}$ form a shift register, the following relationship is established:

$$srg_i(t) = srg_{i+1}(t+1) \tag{1}$$

Here defining a delay operator D and indicating by $D^i$ the condition in a phase delay by i chips of flipflops thereof, Equation (1) may be expressed as follows:

$$srg_i(t) = D^i srg_{i+1}(t)$$

Here expressing the data $b_1$ through $b_n$ using the delay operator D, it may be expressed as follows, based on the arrangement of the modular type shift register generator of FIG. 5:

$$b_i = sr_i(1) = D^{-i} srf(1) \tag{2}$$

For $i \geq 2$, $$b_i = sr_i(1)$$
$$= D^{-1} sr_{i-1}(1) a_i \cdot D^{-1} srf(1) \tag{3}$$

where indicates an exclusive logic sum and · indicates a log product.

Further, since $d_1$ through $d_n$ form a shift register for entering output of the final stage $SR_f$ of the modular type shift register generator serially upon every bit, they may be expressed by: $d_i = srg_i(1) = D^{-i} srf(1) \tag{4}$ Therefore, from Equation (4), they may be expressed by: $d_i = D^{-1} srf(1) = b_i \tag{5}$ Further, for $i \geq 2$, Equation (3) may be modified to:

$$\begin{aligned} b_i &= D^{-1} sr_i - 1(1) \oplus a_i \cdot D^{-1} srf(1) \\ &= D^{-1}(D^{-1} sr_i - 2(1) \oplus a_{i-1} \cdot D^{-1} srf(1)) \oplus \\ &\quad a_i \cdot D^{-1} srf(1) \\ &= D^{-2} sr_i - 2(1) \oplus a_{i-1} \cdot D^{-2} srf(1) \oplus \\ &\quad a_i \cdot D^{-1} sri(1) \\ &= D^{-2}(D^{-1} sri - 3(1) \oplus a_{(i-2)} \cdot D^{-1} srf(1)) \oplus \\ &\quad a_{i-1} \cdot D^{-2} srf(1) \oplus a_i \cdot D^{-1} srf(1) \\ &= D^{-3} sri - 3(1) \oplus a_{i-2} \cdot D^{-3} srf(1) \oplus \\ &\quad a_{i-1} \cdot D^{-2} srf(1) \oplus a_i \cdot D^{-1} srf(1) \\ &\vdots \\ &= D^{-(i-1)} sri(1) \oplus (a_2 \cdot D^{-(i-1)} srf(1) \oplus \\ &\quad (a_3 \cdot D^{-(i-2)} srf(1) \oplus \ldots \oplus a_i \cdot D^{-1} srf(1)) \end{aligned} \tag{6}$$

Here, since $D^{-(i-l)} sr(1)$ may be expressed by $D^{-i} sr_l(1)$ from Equation (2), Equation 6 may be expressed by:

$$b_i = D^{-i} srf(1)(a_2 \cdot D^{-(i-l)} srf(1) a_3$$
$$\cdot D^{-(i-2)} srf(1) a_i \cdot D^{-1} srf(1) \tag{7}$$

and may further be expressed from the relationship of Equation (4) by:

$$b^i = d_i(a_2 \cdot d_{i-1} a_3 \cdot d_{i-2} a_i \cdot d_1)$$

By adding $(a_2 \cdot d_{i-1} a_3 \cdot d_{i-2} a_i \cdot d_1)$ to both sides in module 2, the following relationship is obtained:

$$d_i = b_i(a_2 \cdot d_{i-1} a_3 \cdot d_{i-2} a_i \cdot d_1) \tag{8}$$

From these above, the initial value $d_1$ through $d_n$ of the shift register can be calculated as follows, using code data $b_1$ through $b_n$ and $a_2$ through $a_n$:

$$d_1 = b_1 \tag{5}$$

Using Equation (5) and Equation (8), $d_1$ through $d_n$ are obtained as follows:

$$\begin{aligned} d_1 &= b_1 \\ d_2 &= b_2 \oplus a_2 \cdot d_1 \\ d_3 &= b_3 \oplus a_2 \cdot d_2 \oplus a_3 \cdot d_1 \\ d_4 &= b_4 \oplus a_2 \cdot d_3 \oplus a_3 \cdot d_2 \oplus a_4 \cdot d_1 \\ &\vdots \\ d_n &= b_n \oplus (a_2 \cdot d_{n-1} \oplus a_3 \cdot d_{n-2} \oplus \ldots \oplus a_n \cdot d_1) \end{aligned}$$

Figure 10:
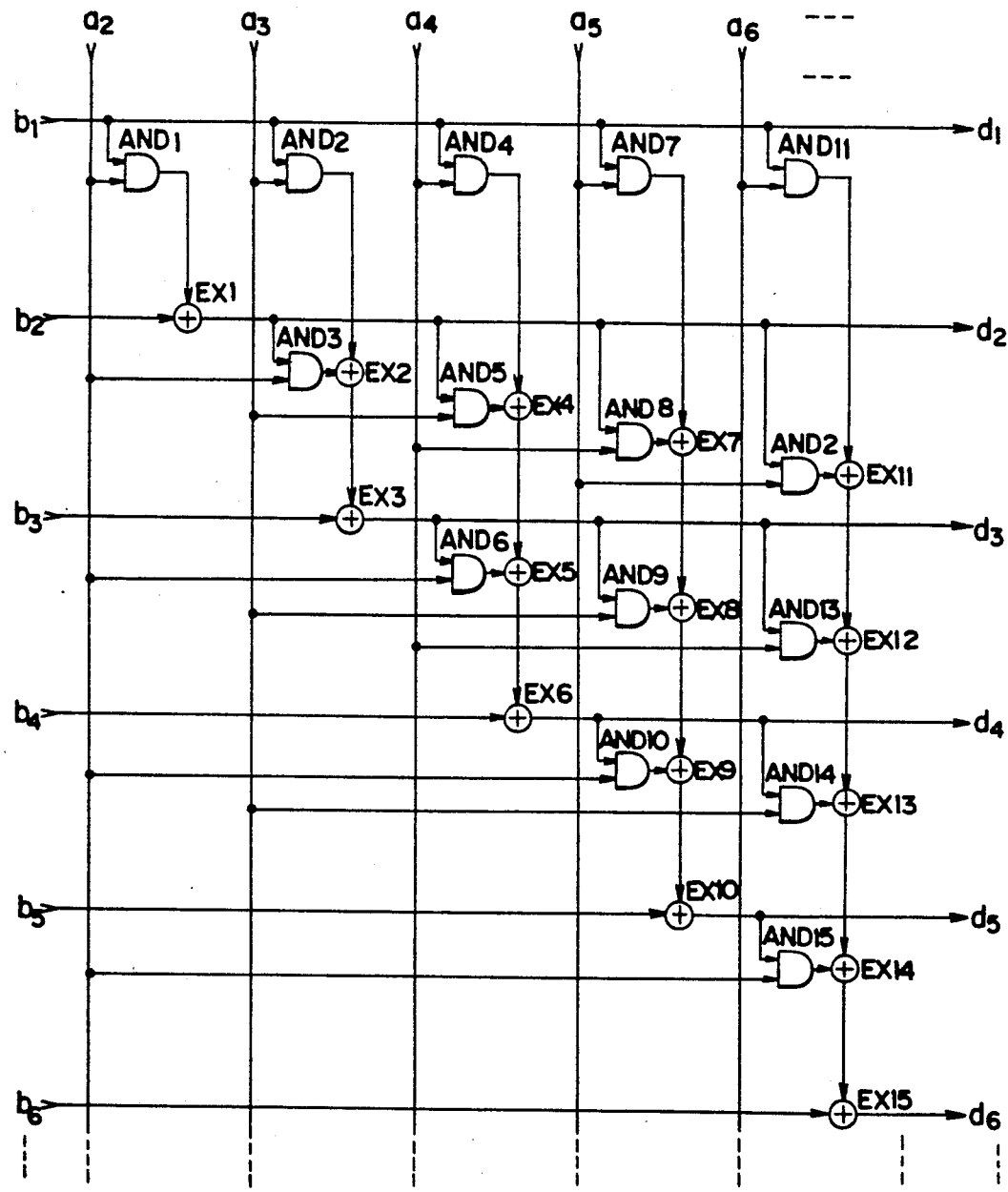
FIG. 10 shows a circuit arrangement of an initial value calculating circuit of a shift register portion.

Therefore, a circuit arrangement of FIG. 10 may be proposed as a specific arrangement of the initial value calculating circuit. In FIG. 10, AND 1 through AND 15 are AND gates, and EX 1 through EX 15 are exclusive logic sum gates. In the arrangement of FIG. 10, since the number of elements is small when the number of stages of the shift registers is small, it is greatly advantageous in reducing the total number of the elements, as compared to the use of the latch circuit of FIG. 4. However, since the number of elements rapidly increases as the number of shift registers increases, the merit regarding reduction of the number of elements is reduced inevitably.

As explained above, according to the invention, by using two pseudorandom noise code generators, it is possible to simultaneously obtain a plurality of synchronizing GOLD codes having different patterns, this enables the use of the system in spread-spectrum communication system, etc. which requires a number of multiple signals.

Besides this, according to the further inventive system including therein the circuits for calculating the initial value of the shift register, such an initial value of the shift register provided for obtaining code outputs in delayed phases by every 1 chip from the modular type shift register generator are automatically calculated in the interior. This enables a reduction of the process and means for obtaining the initial value data from the exterior, and enable a reduction in the number of input terminals and the number of elements.

What is claimed is:

1. A pseudorandom noise code generator comprising:
a simple type shift register generator having a plurality of stages in cascade connection, each said stage including an exclusive logic sum gate, a flipflop and an AND gate, an output of one of said exclusive logic sum gates of one said stage being coupled to an input of the flipflop of such stage, and an output of every other said exclusive logic sum gate being connected to one of two inputs of the exclusive logic sum gate in a preceding stage, one of two inputs of said AND gate being fed with a control signal, the other input of said AND gate being connected to an output of said flipflop, and an output of said AND gate being connected to the other input of said exclusive logic sum gate in the same stage;
a plurality of further exclusive logic sum gates which each have two inputs respectively receiving a signal from an input of the flipflop of a respective said stage and a maximal sequence code from the exterior of the noise code generator; and
a plurality of further flipflops whose outputs are controlled by a clock and which each have applied to an input thereof an output of a respective one of said further exclusive logic sum gates.

2. A pseudorandom noise code generator comprising:
a modular type shift register generator having a plurality of stages in cascade connection, each said stage including an exclusive logic sum gate, a flipflop and an AND gate, an output of said logic sum gate being connected to an input of said flipflop in a subsequent stage, one of two inputs of said exclusive logic sum gate being coupled to an output of said flipflop, the other input of said exclusive logic sum gate being coupled to an output of said AND gate, one of two inputs of said AND gate being connected to a control circuit and the other input of said AND gate being connected to an output of said flipflop in a final stage;
a further shift register having an input to which the output of a predetermined one of said flipflops of said shift register generator is connected and which is provided to obtain a plurality of code outputs having different phases;
steering gate means for setting an initial value of said further shift register from the exterior of the noise code generator;
a plurality of further exclusive logic sum gates which each have two inputs, wherein the output from said predetermined one of said flipflops of said shift register generator and the outputs from flipflops forming said further shift register are each connected to one of the inputs of a respective one of said further logic sum gates, and a maximal sequence code from the exterior of said noise code generator is applied to the other input of each of said further logic sum gates; and
a plurality of further flipflops whose outputs are controlled by a clock and which each have applied to an input thereof an output of a respective one of said further exclusive logic sum gates.

3. A pseudorandom noise code generator comprising:
a modular type shift register generator having a plurality of stages in cascade connection, each said stage including an exclusive logic sum gate, a flipflop and an AND gate, an output of said exclusive logic sum gate being connected to an input of said flipflop in a subsequent stage, one of two inputs of said exclusive logic sum gate being coupled to an output of said flipflop, the other input of said exclusive logic sum gate being coupled to an output of said AND gate, one of two inputs of said AND gate being connected to a control line carrying code data, and the other input of said AND gate being connected to an output of said flipflop in a final stage;
a further shift register having an input to which the output of a predetermined one of said flipflops of said shift register generator is connected and which is provided to obtain a plurality of code outputs having different phases;
initial value circuit means for automatically calculating an initial value for said further shift register from said code data applied to said modular type shift register generator;
a plurality of further exclusive logic sum gates which each have two inputs, wherein the output from said predetermined one of said flipflops of said shift register generator and the output signals of said further shift register are each connected to one of the inputs of a respective one of said further logic sum gates, and wherein a maximal sequence code is applied to the other input of each of said further logic sum gates; and
a plurality of further flipflops whose outputs are controlled by a clock and which each have applied to an input thereof an output of a respective one of said further exclusive logic sum gates.

4. A pseudorandom noise code generator comprising:
a modular type shift register generator having a plurality of stages in cascade connection, each said stage including an exclusive logic sum gate, a flipflop and an AND gate having first and second inputs, an output of said exclusive logic sum gate being connected to an input of said flipflop in a subsequent stage, one of two inputs of said exclusive logic sum gate being coupled to an output of said flipflop, the other input of said exclusive logic sum gate being coupled to an output of said AND gate, said first input of said AND gate being connected to an output of said flipflop in a final stage, said final stage including a multiplexer for supplying to an input of said flipflop of said final stage a signal selected from one of said stages;

a further shift register having an input to which the output of a predetermined one of said flipflops is connected and which is provided to obtain a plurality of code outputs having different phases;

steering gate means for setting an initial value of said further shift register;

a plurality of further exclusive logic sum gates which each have two inputs, wherein the output from said predetermined one of flipflops of said shift register generator and the outputs from respective flipflops forming said further shift register are each connected to one of the inputs of a respective one of said further logic sum gates, and a maximal sequence code from the exterior of said noise code generator is applied to the other input of each of said further logic sum gates;

a plurality of further flipflops whose outputs are controlled by a clock and which each have applied to an input thereof an output from a respective one of said further exclusive logic sum gates; and latch circuits which are respectively loaded under a time division sequence with code phase data, code pattern data, code period data and said initial value of said shift register, said latch circuits being respectively coupled to said shift register generator, said second inputs of said AND gates, control inputs of said multiplexer, and said steering gate means.

5. A pseudorandom noise code generator comprising:
a modular type shift register generator having a plurality of stages in cascade connection, each said stage including an exclusive logic sum gate, a flipflop and an AND gate having first and second inputs, an output of said exclusive logic sum gate being connected to an input of said flipflop in a subsequent stage, one of two inputs of said exclusive logic sum gate being coupled to an output of said flipflop, the other input of said exclusive logic sum gate being coupled to an output of said AND gate; said first input of said AND gate being connected to an output of said flipflop in a final stage, said final stage including a multiplexer for supplying to an input of said flipflop of said final stage a signal selected from one of said stages;

a further shift register having an input to which the output of a predetermined one of said flipflops is connected and which is provided to obtain a plurality of code outputs having different phases;

initial value circuit means for automatically calculating an initial value for said further shift register a plurality of exclusive logic sum gates which each have two inputs, wherein the output from said predetermined one of flipflops of said shift register generator and the output signals of said further shift register are each coupled to one of the input of a respective one of said further logic sum gates, and a maximal sequence code is applied to the other inputs of each of said further logic sum gates;

a plurality of further flipflops whose outputs are controlled by a clock and which each have applied to an input thereof an output from a respective one of said further exclusive logic sum gates; and latch circuits which are respectively loaded under a time division sequence with code phase data, code pattern data and code period data, said latch circuits being respectively coupled to said shift register generator and said initial value circuit means, to said second inputs of said AND gates and said initial value circuit means, and to control inputs of said multiplexer.

6. An apparatus comprising: code generator means responsive to a clock signal for generating a pseudorandom noise code signal, said code generator means including a shift register generator having a plurality of stages; a plurality of exclusive logic sum gates which each have first and second inputs and an output, said first inputs of said gates each having applied thereto a signal from a respective one of said stages of said code generator means, and said second inputs of said gates each having applied thereto a common maximal sequence code; and a plurality of flipflops each having a data input, a data output and a clock input, said clock input of each said flipflop having applied thereto said clock signal, and said data input of each said flipflop being coupled to said output of a respective one of said gates.

7. An apparatus of claim 6, wherein said stages include an initial stage, a final stage, and a plurality of intermediate stages, each of said stages including a further flipflop having a data input, a data output and a clock input to which is applied said clock signal, an AND gate having a first input, a second input coupled to the data output of the flipflop of that stage, and an output, and an exclusive logic sum gate having a first input, a second input coupled to the output of the AND gate of that stage, and an output, the output of the flipflop of each of said initial and intermediate stages being coupled to the data input of the flipflop of a respective one of said intermediate and final stages, said code generator means further including a final flipflop having a data input coupled to the data output of the flipflop of said final stage, a data output coupled to the first input of said logic sum gate of said final stage, and a clock input to which is applied said clock signal, said outputs of said logic sum gates of said intermediate and final stages each being coupled to the first input of the logic sum gate of a respective one of said initial and intermediate stages, and the output of said logic sum gate of said initial stage being coupled to the data input of the flipflop of said initial stage, said first inputs of said AND gates each having applied thereto a respective control signal.

8. An apparatus of claim 7, wherein said code generator means includes a multiplexer having a data output which is coupled to the data input of said final flipflop, having a plurality of data inputs which are each coupled to the data output of a respective one of said final flipflop and said flip-flops of said stages, and having control inputs to which are applied a plurality of control signals.

9. An apparatus of claim 6, including means for initializing said shift register of said code generator means.

10. An apparatus comprising: code generator means responsive to a clock signal for generating a pseudorandom noise code signal; a shift register having an input to which is applied said pseudorandom noise code signal, said shift register having a plurality of stages; a plurality of exclusive logic sum gates which each have first and second inputs and an output, said first inputs of said gates each having applied thereto a signal from a respective said stage of said shift register, and said second inputs of said gates each having applied thereto a common maximal sequence code; and a plurality of flipflops each having a data input, a data output, and a clock input to which is applied said clock signal, said data input of each said flipflop being coupled to the output of a respective one of said logic sum gates.

11. An apparatus of claim 10, including means for initializing said shift register.

12. An apparatus of claim 11, wherein said code generator means generates said pseudorandom noise code signal as a function of code control signals which are applied to said code generator means, wherein each said stage of said shift register includes a flipflop, and wherein said means for initializing said shift register includes gating means responsive to said code control signals for defining for each said flipflop of said shift register a respective initial state.

13. An apparatus of claim 11, wherein said shift register includes a plurality of flipflops each having a data input, a data output, and a clock input to which is applied said clock signal, and wherein said means for initializing said shift register includes a plurality of steering gates which each have a control input to which is applied a common select signal, a first data input to which is applied a respective initialization signal, a second data input which is coupled to the data output of a respective one of said flipflops, and a data output, said data output of each of said steering gates other than one thereof being connected to a data input of a respective one of said flipflops, said first inputs of said exclusive logic sum gates each being coupled to the data output of a respective one of said steering gates.

* * * * *